United States Patent
Lin

(10) Patent No.: US 7,787,298 B2
(45) Date of Patent: *Aug. 31, 2010

(54) METHOD FOR PREVENTING MEMORY FROM GENERATING LEAKAGE CURRENT AND MEMORY THEREOF

(75) Inventor: Yung-Feng Lin, Taoyuan County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/289,576

(22) Filed: Oct. 30, 2008

(65) Prior Publication Data

US 2009/0059663 A1 Mar. 5, 2009

Related U.S. Application Data

(63) Continuation of application No. 11/723,809, filed on Mar. 22, 2007, now Pat. No. 7,471,561.

(60) Provisional application No. 60/859,254, filed on Nov. 16, 2006.

(51) Int. Cl.
*G11C 11/34* (2006.01)
(52) U.S. Cl. .................. 365/185.05; 365/63; 365/214
(58) Field of Classification Search ............ 365/185.05, 365/63, 214
See application file for complete search history.

(56) References Cited

U.S. PATENT DOCUMENTS

| | | | | |
|---|---|---|---|---|
| 6,097,660 | A * | 8/2000 | Tsuchida et al. | 365/230.03 |
| 6,757,197 | B2 * | 6/2004 | Kamei | 365/185.23 |
| 6,819,590 | B2 * | 11/2004 | Goda et al. | 365/185.03 |
| 7,471,561 | B2 * | 12/2008 | Lin | 365/185.05 |
| 2008/0285326 | A1 * | 11/2008 | Alami et al. | 365/72 |

* cited by examiner

*Primary Examiner*—Tuan T. Nguyen
(74) *Attorney, Agent, or Firm*—Rabin & Berdo, P.C.

(57) ABSTRACT

A method for preventing a memory from generating a leakage current is disclosed. The memory includes a boundary memory cell and a neighboring memory cell. The neighboring memory cell is adjacent to the boundary memory cell. The method includes the following step. The first terminal of the neighboring memory cell is connected to the second terminal through a metal line.

10 Claims, 2 Drawing Sheets

METHOD FOR PREVENTING MEMORY FROM GENERATING LEAKAGE CURRENT AND MEMORY THEREOF

This application is a continual application of co-pending application Ser. No. 11/723,809, filed on Mar. 22, 2007.

BACKGROUND OF THE INVENTION

1. Field of the Invention

The invention relates in general to a method for preventing a memory from generating a leakage current and a memory thereof, and more particularly to a method capable of preventing leakage current and preventing a memory from generating a leakage current and a memory thereof.

2. Description of the Related Art

The technology of non-volatile memory is widely used in many applications including the flash memory. Normally, the flash memory is a virtual ground array memory. During the process of erasing the memory cell of the flash memory, the threshold voltage of the memory cell is lowered.

Referring to FIG. 1, a perspective of a conventional flash memory is shown. The flash memory 100 includes a memory cell block 110 and a neighboring memory cell 122. The memory cell block 110 includes a boundary memory cell 112. FIG. 1 is exemplified by one row of memory cells, however, the invention is not limited thereto. The neighboring memory cell 122 is adjacent to the boundary transistor 112. During the process of erasing the left bit 113 of the boundary memory cell 112, since the erasing process is achieved according to the source side erasing technology, the right bit 123 of the neighboring memory cell 122 might be over-erased, such that the threshold voltage of the memory cell 122 is too low, and a leakage current flowing to the neighboring memory cell 122 might be generated by the boundary memory cell 112, severely affecting the normal operation of the boundary memory cell 112.

To resolve the above problem, the right bit 123 of the neighboring memory cell 122 can be programmed to a high level voltage either before or after the process of erasing the left bit 113 of the boundary memory cell 112. Thus, the voltage level at the right bit 123 of the neighboring memory cell 122 is larger than the voltage level at the left bit 113 of the boundary memory cell 112, such that leakage current is prevented. The above method is capable of reducing the leakage current during the erasing process. However, the above processing needs to be applied to the memory cells at each row of the flash memory 100, which is labor-consuming and requires a long duration of programming time.

SUMMARY OF THE INVENTION

The invention is directed to a method for preventing a memory from generating a leakage current and a memory thereof. By using a simple method disclosed in the invention, the leakage current caused by the erasing operation is reduced.

According to a first aspect of the present invention, a method for preventing a memory from generating a leakage current is provided. The memory includes a boundary memory cell and a neighboring memory cell. The neighboring memory cell is adjacent to the boundary memory cell. The method includes the following step. The first terminal and the second terminal of the neighboring memory cell are connected through a metal line.

According to a second aspect of the present invention, a memory including a memory cell block and a column of neighboring memory cells is provided. The memory cell block has a column of boundary memory cells. The column of neighboring memory cells is adjacent to the column of boundary memory cells, and the column of neighboring memory cells has a plurality of neighboring memory cells. Each first terminal of the neighboring memory cell and each second terminal of the neighboring memory cell are respectively connected through a metal line.

The invention will become apparent from the following detailed description of the preferred but non-limiting embodiments. The following description is made with reference to the accompanying drawings.

DETAILED DESCRIPTION OF THE INVENTION

A method for preventing a memory from generating a leakage current and the memory thereof are provided in the invention. By using a simple method disclosed in the invention, the first terminal of the neighboring memory cell is connected to the second terminal through a metal line, hence reducing the leakage current caused by the erasing process.

Figure 1:
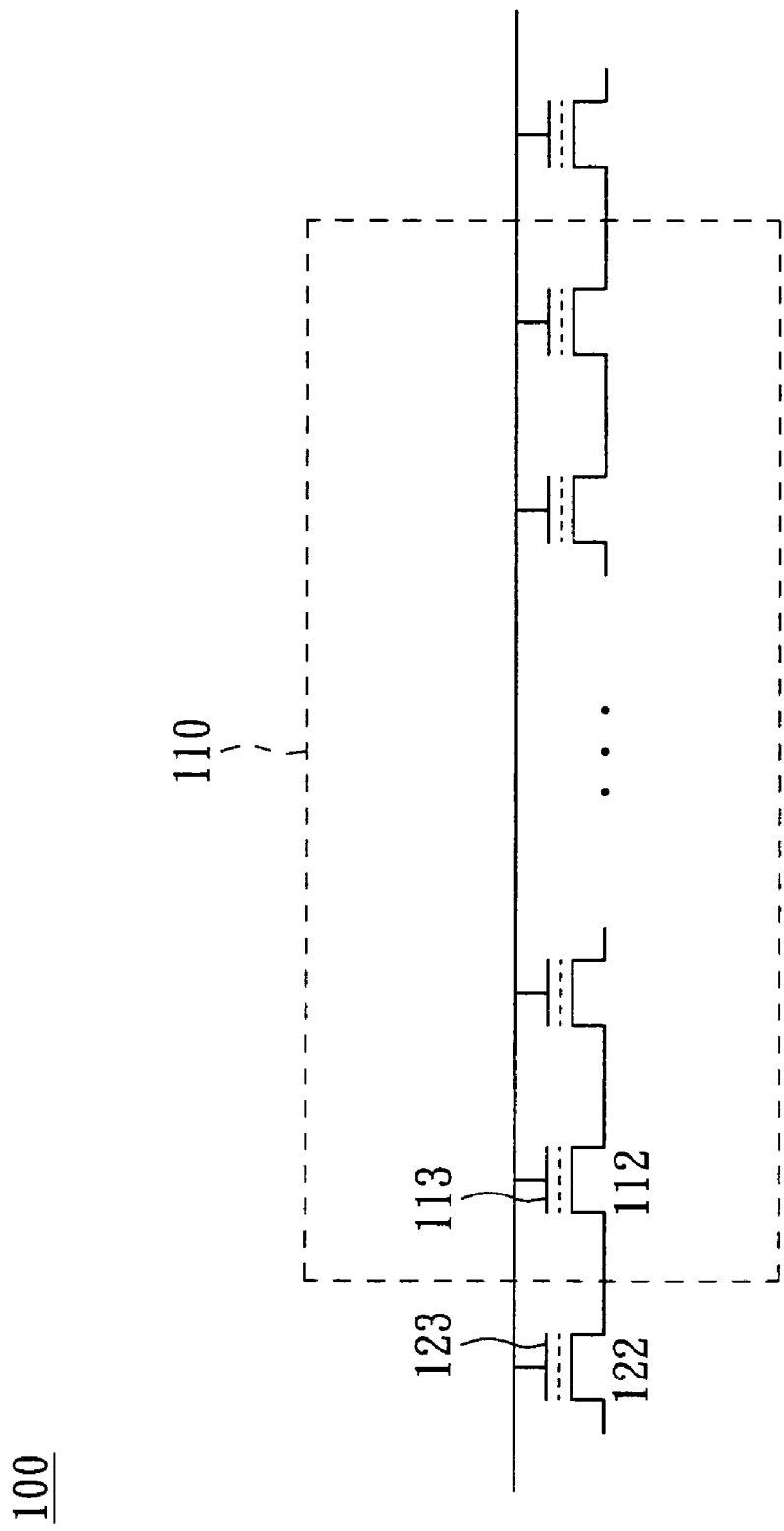
FIG. 1 is a perspective of a conventional flash memory.
Figure 2:
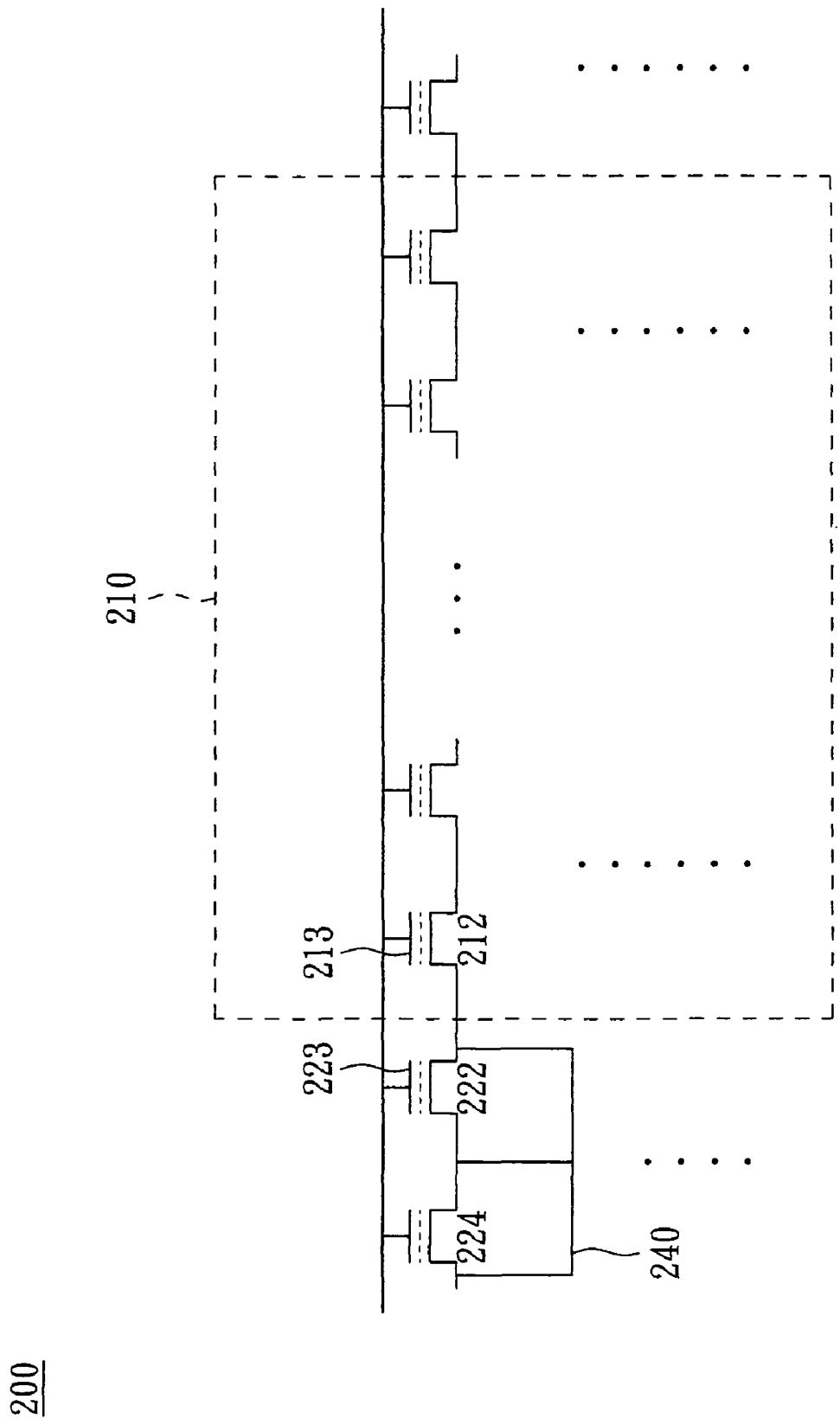
FIG. 2 is a perspective of a memory according to a preferred embodiment of the invention.

Referring to FIG. 2, a perspective of a memory according to a preferred embodiment of the invention is shown. The memory 200 exemplified by a flash memory includes a memory cell block 210 and a column of neighboring memory cells 222. The memory cell block 210 has a column of boundary memory cells 212. Only one row of memory cells is illustrated in FIG. 2 for exemplification, however invention is not limited thereto. Each column of memory cells includes a plurality of memory cells. The neighboring memory cell 222 is adjacent to the boundary memory cell 212.

During the process of erasing the left bit 213 of the boundary memory cell 212, since the erasing process is performed according to the source side erasing technology, the right bit 223 of the neighboring memory cell 222 might be over-erased, such that the threshold voltage of the memory cell 222 is too low, and a leakage current flowing to the neighboring memory cell 222 might be generated by the boundary memory cell 212, severely affecting the normal operation of the boundary memory cell 212. Therefore, the first terminal of the neighboring memory cell 222 is electrically connected to the second terminal of the neighboring memory cell 222 through a metal line 240.

Thus, the voltage level at the first terminal of the neighboring memory cell 222 will be equal to the voltage level at the second terminal of the neighboring memory cell 222, such that the leakage current generated by the boundary memory cell 212 is reduced. In case when a leakage current is generated, the leakage current will flow back to the boundary memory cell 212 due to the circuit loop formed by the neighboring memory cell 222, such that the impact of the leakage current is reduced to a minimum. Besides, the first terminal of the other neighboring memory cell 224 can be connected to the second terminal of the other neighboring memory cell 224 through the metal line 240 for enabling the voltage level at the first terminal of the neighboring memory cell 224 to be equal to the voltage level at the second terminal of the neighboring memory cell 224. The other neighboring memory cell 224 is adjacent to the neighboring memory cell 222. Therefore, the leakage current is prevented from flowing to the neighboring memory cell 222 form the boundary memory cell 212 and the normal operation of the boundary memory cell 212 is assured.

A method for preventing a memory from generating a leakage current and a memory thereof are disclosed in the above embodiments of the invention. According to the method disclosed in the invention, a metal line enables the voltage levels at the two terminals of the neighboring memory cell to be identical, such that the boundary memory cell will not generate a leakage current and the reading operation of the boundary memory cell will not be affected. Meanwhile, high accuracy is achieved when the memory is verified or operated.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for preventing a memory from generating a leakage current, wherein the memory comprises a boundary memory cell and a neighboring memory cell, the neighboring memory cell is adjacent to the boundary memory cell, the method comprises:
    coupling a first terminal of the neighboring memory cell to a second terminal of the neighboring memory cell.

2. The method for preventing a memory from generating a leakage current according to claim 1, wherein the voltage level at the first terminal of the neighboring memory cell is equal to the voltage level at the second terminal of the neighboring memory cell.

3. The method for preventing a memory from generating a leakage current according to claim 2, wherein the first terminal of the neighboring memory cell is electrically coupled to the second terminal of the neighboring memory cell for preventing the boundary memory cell from generating a leakage current.

4. The method for preventing a memory from generating a leakage current according to claim 1, wherein the memory is a flash memory.

5. The method for preventing a memory from generating a leakage current according to claim 1, wherein the neighboring memory cell is adjacent to the other neighboring memory cell, the method further comprises:
    coupling the first terminal of the other neighboring memory cell to the second terminal of the other neighboring memory cell.

6. A memory, comprising:
    a memory cell block having a column of boundary memory cells; and
    a column of neighboring memory cells adjacent to the column of boundary memory cells, wherein the column of neighboring memory cells has a plurality of neighboring memory cells;
    wherein each first terminal of the neighboring memory cells and each second terminal of the neighboring memory cells are respectively coupled.

7. The memory according to claim 6, wherein the voltage level at each first terminal of the neighboring memory cells is respectively equal to the voltage level at each second terminal of the neighboring memory cells.

8. The memory according to claim 7, wherein each first terminal of the neighboring memory cells is respectively electrically coupled to each second terminal of the neighboring memory cells for preventing each boundary memory cell from generating a leakage current.

9. The memory according to claim 6, being a flash memory.

10. The memory according to claim 6, further comprising:
    another column of neighboring memory cells being adjacent to the column of neighboring memory cells, wherein said another column of neighboring memory cells has a plurality of neighboring memory cells;
    wherein each first terminal of said another column of neighboring memory cells is respectively coupled to each second terminal of said another column of neighboring memory cells.

* * * * *